United States Patent
Okuyama et al.

(10) Patent No.: US 7,547,370 B2
(45) Date of Patent: *Jun. 16, 2009

(54) METHOD FOR MANUFACTURING MULTILAYER CERAMIC ELECTRONIC ELEMENT

(75) Inventors: Shingo Okuyama, Takefu (JP); Hiroyoshi Takashima, Sabae (JP); Akira Hashimoto, Takefu (JP); Shinichi Kokawa, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/611,552

(22) Filed: Dec. 15, 2006

(65) Prior Publication Data

US 2007/0095456 A1    May 3, 2007

Related U.S. Application Data

(62) Division of application No. 10/925,447, filed on Aug. 25, 2004, now Pat. No. 7,503,993, which is a division of application No. 10/318,264, filed on Dec. 13, 2002, now abandoned.

(30) Foreign Application Priority Data

Dec. 14, 2001 (JP) .............................. 2001-381707
Jan. 15, 2002 (JP) .............................. 2002-006113

(51) Int. Cl.
*C03B 29/02* (2006.01)
*B32B 38/14* (2006.01)
*B32B 37/15* (2006.01)
*B32B 37/02* (2006.01)
*C09J 5/04* (2006.01)
*B41F 9/06* (2006.01)
*B28B 5/02* (2006.01)
*C03B 29/06* (2006.01)
*B32B 37/26* (2006.01)
*H01G 7/04* (2006.01)
*C04B 33/34* (2006.01)

(52) U.S. Cl. .............. 156/89.12; 156/89.14; 156/89.16; 156/277; 156/307.5; 427/79; 427/80; 427/96.1; 427/126.2; 427/126.3; 264/297.4; 264/605; 29/25.42; 101/153; 101/170

(58) Field of Classification Search ............. 156/89.12, 156/89.14, 89.16, 307.5, 563; 264/297.4, 264/605; 427/79, 80, 96.1, 126.2, 126.3; 29/25.42; 101/153, 170
See application file for complete search history.

(56) References Cited

U.S. PATENT DOCUMENTS

| | | | |
|---|---|---|---|
| 5,101,319 A | 3/1992 | Diffeyes et al. | |
| 5,292,548 A | 3/1994 | Rainwater | |
| 5,534,290 A | 7/1996 | Rainwater et al. | |
| 5,700,548 A | 12/1997 | Warnier et al. | |
| 5,716,481 A | 2/1998 | Kobayashi et al. | |
| 5,865,920 A * | 2/1999 | Sakuratani et al. | 156/89.16 |
| 5,935,358 A * | 8/1999 | Yamasaki | 156/89.12 |
| 6,428,644 B1 | 8/2002 | Ohno et al. | |
| 6,431,956 B1 | 8/2002 | Otsuka | |
| 6,475,317 B1 * | 11/2002 | Baba et al. | 156/89.12 |
| 7,047,880 B2 * | 5/2006 | Ishimoto et al. | 101/170 |
| 2001/0006451 A1 | 7/2001 | Miyazaki et al. | |
| 2001/0015250 A1 | 8/2001 | Tokuda et al. | |
| 2003/0111158 A1 * | 6/2003 | Okuyama et al. | 156/89.12 |
| 2004/0163555 A1 | 8/2004 | Ishimoto et al. | |
| 2005/0016661 A1 * | 1/2005 | Okuyama et al. | 156/89.12 |

FOREIGN PATENT DOCUMENTS

| | | | |
|---|---|---|---|
| JP | 02-066916 A | | 3/1990 |
| JP | 03-105905 A | | 5/1991 |
| JP | 03-108307 A | | 5/1991 |
| JP | 06-096991 A | | 4/1994 |
| JP | 07-014745 A | | 1/1995 |
| JP | 07-086083 A | | 3/1995 |
| JP | 7-122457 | * | 5/1995 |
| JP | 07122457 A | * | 5/1995 |
| JP | 08-130154 A | | 5/1996 |
| JP | 08-250370 A | | 9/1996 |

| | | | |
|---|---|---|---|
| JP | 09-129504 A | | 5/1997 |
| JP | 11-008156 A | | 1/1999 |
| JP | 11-138091 | * | 5/1999 |
| JP | 11138091 A | * | 5/1999 |
| JP | 11-340077 A | | 12/1999 |
| JP | 2000-084459 | * | 3/2000 |
| JP | 2000084459 A | * | 3/2000 |
| JP | 2001-023854 A | | 1/2001 |
| JP | 2001-203123 A | | 7/2001 |
| JP | 2001-212489 A | | 8/2001 |
| JP | 2003133167 A | * | 5/2003 |

OTHER PUBLICATIONS

Official communication issued in the corresponding Japanese Patent Application No. 2002-006113, dated Aug. 22, 2006.
Official communication issued in the corresponding Japanese Patent Application No. 2001-381707, dated Feb. 28, 2006.

* cited by examiner

*Primary Examiner*—Philip C Tucker
*Assistant Examiner*—Sonya Mazumdar
(74) *Attorney, Agent, or Firm*—Keating & Bennett, LLP (57) ABSTRACT

A method for manufacturing a multilayer ceramic electronic element includes the steps of forming ceramic green sheets having superior surface smoothness and small variations in thickness at a high speed, in which defects such as pinholes are prevented from occurring, and providing internal electrodes and step-smoothing ceramic paste on the ceramic green sheets with high accuracy. The method includes the steps of applying ceramic slurry to a base film by a die coater followed by drying performed in a drying furnace for forming the ceramic green sheets, and performing gravure printing of conductive paste and ceramic paste onto the ceramic green sheets by using a first and a second gravure printing apparatus, respectively. Accordingly, the internal electrodes are formed, and the step-smoothing ceramic paste is provided in regions other than those in which the internal electrodes are formed.

11 Claims, 10 Drawing Sheets

METHOD FOR MANUFACTURING MULTILAYER CERAMIC ELECTRONIC ELEMENT

This application is a Divisional Application of U.S. patent application Ser. No. 10/925,447 filed Aug. 25, 2004 now U.S. Pat. No. 7,503,993, which is a Divisional application of U.S. patent application Ser. No. 10/318,264 filed Dec. 13, 2002, abandoned.

BACKGROUND OF THE INVENTION

1. Field of the Invention

The present invention relates to methods for manufacturing multilayer ceramic electronic elements such as a multilayer ceramic capacitor, and more particularly, relates to an improved method for manufacturing a multilayer ceramic electronic element having a structure in which a ceramic sintered body includes internal electrodes laminated to each other with ceramic layers provided therebetween and in which steps between portions at which the internal electrodes are formed and portions at which the internal electrodes are not formed are smoothed.

2. Description of the Related Art

When multilayer ceramic electronic elements, such as a multilayer ceramic capacitor, are formed, a plurality of ceramic green sheets having internal electrodes printed thereon is laminated to each other. In addition, ceramic green sheets having no internal electrodes are provided at the top and the bottom of the stack of ceramic green sheets thus laminated to form a laminate body. After being compressed in the thickness direction of the laminate body, the laminate body is fired, thereby forming a ceramic sintered body.

When the laminate body described above is compressed, the portion at which the internal electrodes overlap each other and the portion at which the internal electrodes are not formed have thicknesses that are different from each other, and as a result, there has been a problem in that steps are formed between the two portions described above.

In Japanese Unexamined Patent Application Publication No. 8-250370, a method for manufacturing a multilayer ceramic capacitor has been disclosed in which the steps as described above can be smoothed. According to this manufacturing method, ceramic slurry is first printed onto base films by gravure printing to form dielectric ceramic green sheets. Next, conductive paste is applied by gravure printing to the ceramic green sheets thus formed so as to form internal electrodes. Subsequently, ceramic paste for smoothing steps is applied by gravure printing, in a manner similar to the printing mentioned above, to regions in which the internal electrodes are not printed, and the internal electrodes and the ceramic paste for smoothing steps are then dried. By repeating these steps described above at least twice, the structure can be formed in which at least two composite sheets, which are each formed of the internal electrodes and a ceramic pattern for smoothing steps printed onto the base film, are laminated to each other. When a plurality of the composite sheets thus formed is laminated to each other and is then compressed in the thickness direction, a laminate body can be formed, and by firing this laminate body, a ceramic sintered body can be obtained.

According to the technique disclosed in the publication described above, on the surface of the ceramic green sheet, since the ceramic pattern for smoothing steps is printed in regions in which the internal electrodes are not printed, the steps, which are formed between the portion at which the internal electrodes overlap each other and the portion at which the internal electrodes are not formed, can be smoothed.

The miniaturization and higher capacity of multilayer ceramic capacitors have been increasingly advanced, and along with this advancement, attempts to increase the number of layers of the internal electrodes and to decrease the thickness of the ceramic green sheet have been made. As a result, the thickness of the ceramic green sheet is decreased to 3 μm or less, and in some cases, the thickness thereof is even more decreased to 2 μm or less.

In the ceramic green sheet having a small thickness as described above, pin holes may be easily formed or the surface smoothness may be degraded in some cases. In addition, as the number of the internal electrodes is increased, the influence of the steps, which are formed between the portions at which the internal electrodes overlap each other and the portions at which the internal electrodes are not formed, becomes significant.

Accordingly, there has been a problem in that appearance defects of the ceramic sintered body thus formed occur because of the presence of the steps described above, or structural defects, delamination, or other problems occur because of the difference in density between both sides of the step.

According to the technique disclosed in Japanese Unexamined Patent Application Publication No. 8-250370, as described above, an attempt has been made to smooth the steps by printing the ceramic pattern provided for smoothing steps.

Figure 7:
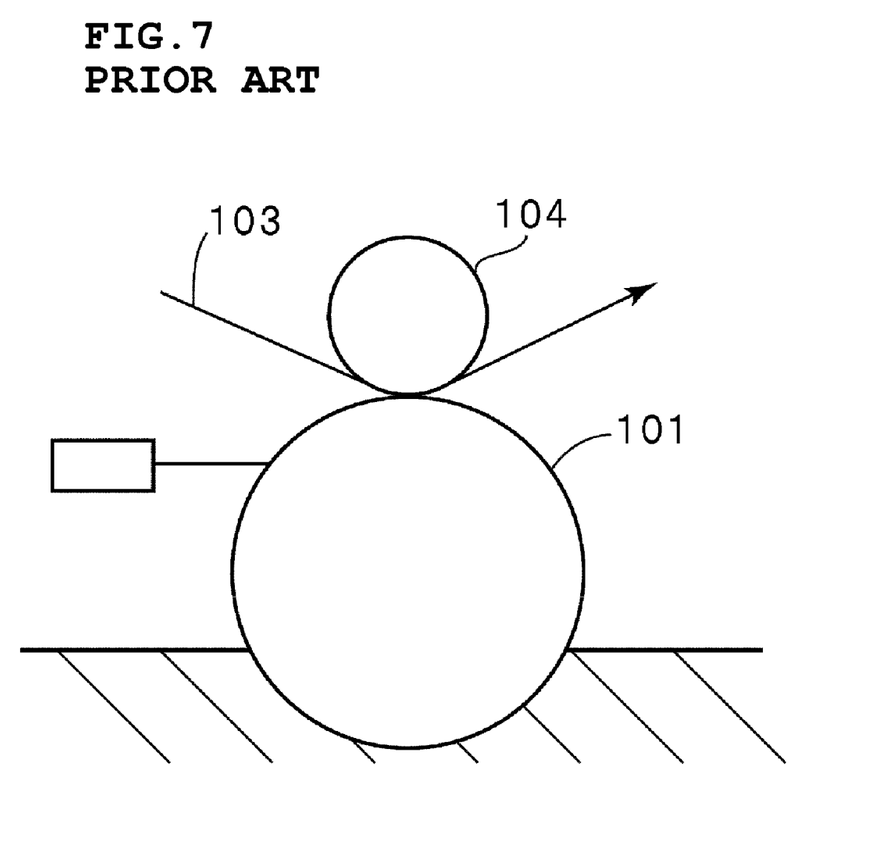
FIG. 7 is a schematic view showing the structure for performing gravure printing of ceramic paste according to a conventional method for manufacturing a multilayer ceramic electronic element.
Figure 8A:
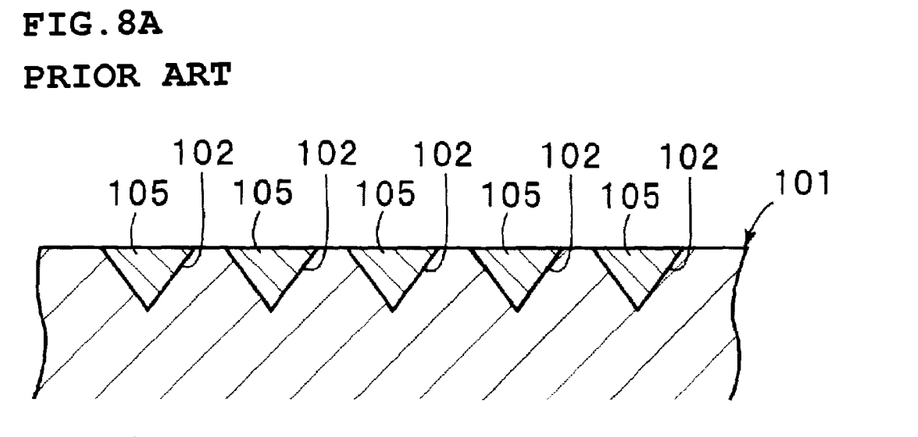
FIGS. 8A to 8C are partially enlarged cross-sectional views showing steps of supplying ceramic paste from a gravure roller to a base film for printing according to a conventional method.

However, according to the technique described above, the formation of the ceramic green sheet is performed by gravure printing. In gravure printing, as shown in FIG. 7, a gravure roller 101 having a plurality of printing portions provided on the peripheral surface thereof and aligned in the circumferential direction is used. One printing portion provided on the peripheral surface of the gravure roller 101 is composed of a great number of cells 102, as shown in FIG. 8A.

Figure 8B:
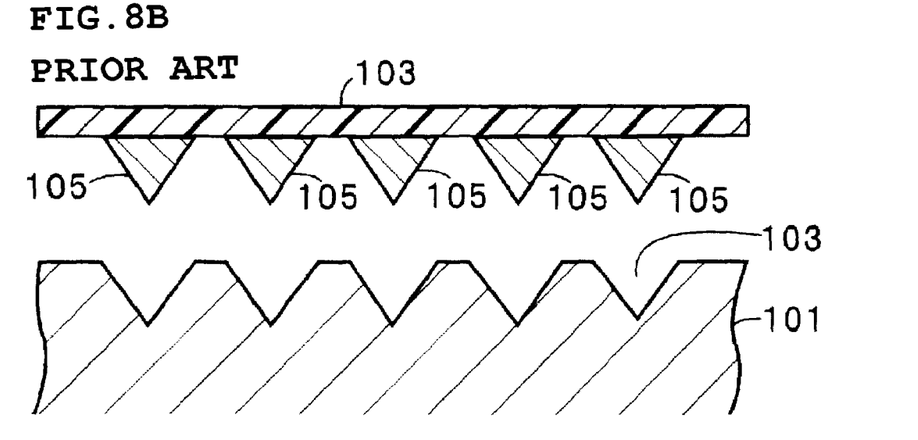
Figure 8C:
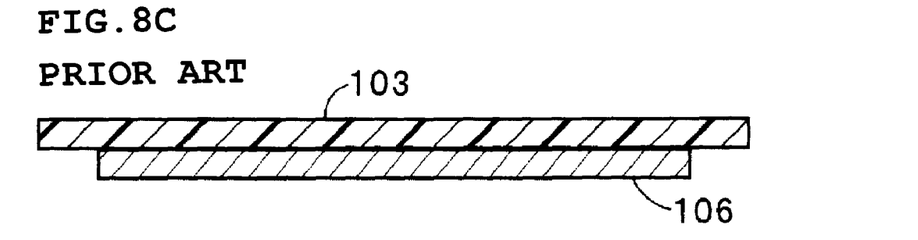

According to the technique described above, a long base film 103 shown in FIG. 7 is conveyed in the direction indicated by the arrow in the figure, and by using the gravure roller 101 and a roller 104 pressing the base film 103 to the gravure roller 101, printing is performed. For example, when a ceramic green sheet is printed, as shown in FIG. 8A, ceramic slurry 105 is applied to a great number of the cells 102, which form a printing figure, and is then transferred to one major surface of the base film. In this case, as shown in FIG. 8B, the ceramic slurry 105 is dispersed on the base film 103 so as to form a shape that conforms with that of the cells 102. Subsequently, the ceramic slurry 105 dispersed at one position is brought into contact with that dispersed at an adjacent position with time, and hence, as shown in FIG. 8C, leveling is performed, thereby forming a flat ceramic green sheet 106.

However, as described above, according to gravure printing, since the ceramic slurry 105 is transferred from a great number of the cells 102 to the base film 103, and the ceramic green sheet is formed by leveling, there has been a problem in that a time required for forming the ceramic green sheet 106 is determined by the time required for leveling. Accordingly, specifically in the case in which the number of sheets to be laminated to each other is increased, the formation of the ceramic green sheets takes a long period of time, and hence the cost is disadvantageously increased.

In addition, as described above, the ceramic slurry is transferred from a plurality of the cells, and leveling is then performed. However, irregularities tend to be formed on the surface of the ceramic green sheet thus formed, and as a result, the surface smoothness thereof may not be satisfactory in some cases. In addition, variation in thickness of the ceramic green sheet is also inevitably increased. Furthermore, when the thickness of the ceramic green sheet is decreased, a problem may arise in that pinholes are likely to be formed. As a result, for the technique disclosed in the above-described publication, it has been very difficult to respond the trend toward thinner ceramic green sheets.

In addition, after the internal electrodes are formed, the ceramic pattern for smoothing steps is then formed by gravure printing, and next, the internal electrodes and the ceramic pattern are simultaneously dried. Accordingly, exudation is liable to occur between the internal electrodes and the ceramic pattern, and as a result, it has been difficult to improve printing accuracy of the internal electrodes. In particular, after the internal electrodes are printed, exudation is liable to occur along the peripheries of the internal electrodes before the ceramic pattern is printed. Hence, variations in electrostatic capacity of a multilayer capacitor, which is obtained as a product, is inevitably increased.

In addition, according to the technique described in the publication discussed above, after being formed, the ceramic green sheets are in contact with a solvent contained in the conductive paste for forming internal electrode or a solvent contained in the ceramic paste for forming the ceramic pattern for a long period of time. Accordingly, the ceramic green sheet may be damaged by the solvent in some cases, and hence short-circuiting, insulation defect, or other problems are liable to occur in the resulting multilayer capacitor.

SUMMARY OF THE INVENTION

In order to overcome the problems described above, preferred embodiments of the present invention provide a method for manufacturing a multilayer ceramic electronic element having high performance. According to the method of preferred embodiments of the present invention, even when the thickness of a ceramic green sheet is decreased, pinholes are prevented from being formed therein, a ceramic green sheet having superior surface smoothness is easily and readily formed at a reasonable cost, internal electrodes are formed with high accuracy, desirable properties are securely obtained, and undesirable short-circuiting and insulation defects are unlikely to occur.

According to a preferred embodiment of the present invention, a method for manufacturing a multilayer ceramic electronic element, includes the steps of applying ceramic slurry to a base film using a die coater for forming ceramic green sheets, applying conductive paste to the upper surfaces of the ceramic green sheets by gravure printing for forming internal electrodes, printing ceramic paste (hereinafter referred to as "step-smoothing ceramic paste) for smoothing steps onto the upper surfaces of the ceramic green sheets in regions other than those in which the internal electrodes are formed, laminating the ceramic greens sheets having the internal electrodes and the step-smoothing ceramic paste to each other with at least one ceramic green sheet having neither the internal electrodes nor the step-smoothing ceramic paste for forming a laminate, firing the laminate for forming a sintered body, and forming external electrodes on external surfaces of the sintered body so as to be electrically connected to the internal electrodes.

The method described above according to a preferred embodiment of the present invention may further include a step of drying or partially drying the internal electrodes continuously after the applying step for forming the internal electrodes. The internal electrodes are formed by applying conductive paste, and it is not always necessary that this conductive paste be in a fully dried state. As described above, the conductive paste may also be in a partially dried state. In the present invention, the partially dried state means a state in which a solvent is not totally removed, but the shapes of the internal electrodes thus printed are maintained. That is, the state in which the solvent is partially removed so that exudations or other defects and problems in the internal electrodes are prevented from occurring. As described above, when being semi-dried or dried after the applying step for forming the internal electrodes, the internal electrodes are unlikely to exude, and hence the accuracy of the internal electrodes can be further improved.

In the method according to preferred embodiments of the present invention described above, the applying step for forming the internal electrode may precede the printing step of printing the step-smoothing ceramic paste, or vice versa.

In addition, the method described above may further include a step of drying the step-smoothing ceramic paste following the printing step, and as a result, a composite sheet thus formed can be immediately removed.

In the method according to a preferred embodiment of the present invention described above, the base film may be a long base film, and the forming step may be performed while the long base film is conveyed in the length direction thereof. Accordingly, long ceramic green sheets can be obtained at very high speed by using a die coater.

In the method according to a preferred embodiment of the present invention described above, the applying step and the printing step may be continuously performed while the long ceramic green sheets are conveyed in the length direction thereof. When these two steps are continuously performed, the productivity of the multilayer ceramic electronic element can be improved.

In the method according to a preferred embodiment of the present invention described above, after the application step for forming the internal electrodes, the printing step of printing the step-smoothing ceramic paste may be performed. Alternatively, after the printing step of printing the step-smoothing ceramic paste, the applying step for forming the internal electrodes may be performed.

In the method according to preferred embodiments of the present invention described above, the ceramic green sheets and the step-smoothing ceramic paste may primarily form a dielectric ceramic used for a multilayer ceramic capacitor as the multilayer ceramic electronic element. The method for manufacturing a multilayer ceramic electronic element, according to preferred embodiments of the present invention, is preferably used for the production of multilayer ceramic capacitors and, in addition, may also be applied to the production of other multilayer ceramic electronic elements other than the multilayer ceramic capacitors. As the other multilayer ceramic electronic elements, for example, multilayer inductors, multilayer noise filters, multilayer thermistors, multilayer varistors, multilayer LC filters, high-frequency module ceramic multilayer substrates and other suitable multilayer electronic components may be formed according to this method.

Other elements, features, characteristics and advantages of the present invention will become more apparent from the following detailed description of preferred embodiments of the present invention.

BRIEF DESCRIPTION OF THE DRAWINGS

FIGS. 1A and 1B are schematic views showing manufacturing apparatuses used for a preferred embodiment of the present invention, where

FIGS. 2A to 2C are views showing manufacturing steps according to a preferred embodiment of the present invention, where

DETAILED DESCRIPTION OF PREFERRED EMBODIMENTS

Hereinafter, referring to drawings, particular preferred embodiments will be described so that the present invention will be clearly understood.

Figure 1A:
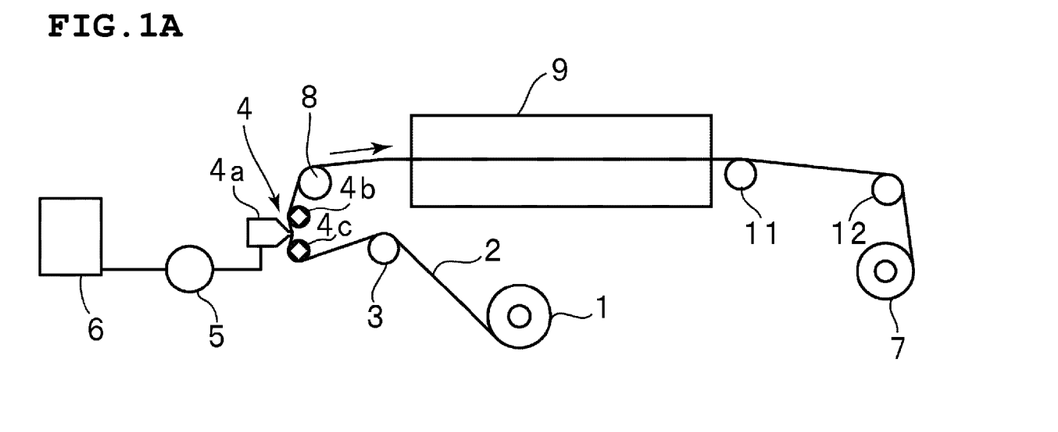
FIG. 1A is a schematic view showing a manufacturing apparatus including a die coater for forming a ceramic green sheet.
Figure 1B:
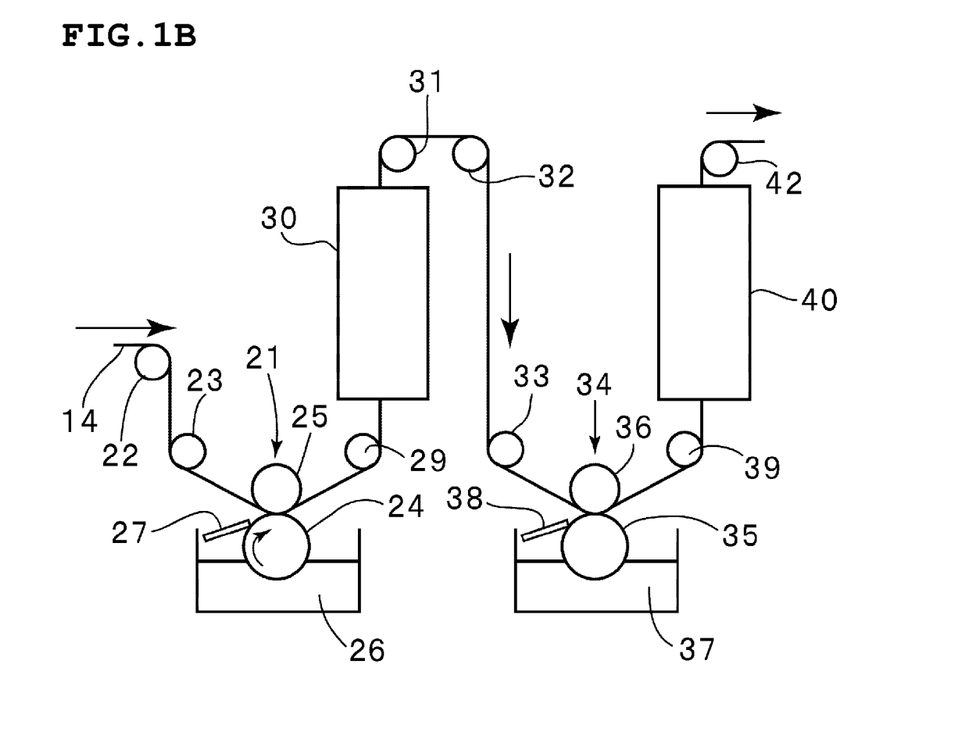
FIG. 1B is a schematic view showing the structure including a first and a second gravure printing apparatus for printing internal electrodes and step-smoothing ceramic paste.

FIGS. 1A and 1B are schematic views each showing the structure of an apparatus used for a method for manufacturing a multilayer ceramic electronic element, according to one preferred embodiment of the present invention; FIG. 1A is a view showing the structure of an apparatus preferably used for forming a ceramic green sheet; and FIG. 1B is a view showing the structure of an apparatus for performing gravure printing of internal electrodes and ceramic paste. In this preferred embodiment, as the multilayer ceramic electronic element, multilayer ceramic capacitors are preferably manufactured.

As shown in FIG. 1A, a long base film 2 is supplied to a die coater 4 from a supply reel 1 through a roller 3. As the base film 2, a film made of an appropriate synthetic resin, such as polypropylene (PP), poly(ethylene terephthalate) (PET), or poly(ethylene naphthalate) (PEN), or other suitable material, is preferably used.

The die coater 4 has a coating head 4a and rollers 4b and 4c. The coating head 4a is communicated to a tank 6 containing ceramic slurry through a pump 5. By the pump 5, the ceramic slurry is supplied to the coating head 4a and is then applied to one major surface of the base film 2 from a front end of the coating head 4a.

The base film 2 is conveyed from the supply roller 1 to a take-up reel 7 shown in FIG. 1A. The ceramic slurry, which is ejected from the coating head 4a on the base film 2 and forms a predetermined thickness thereon, is supplied to a drying furnace 9 through a roller 8. In the drying furnace 9, the ceramic slurry is dried, thereby forming a ceramic green sheet.

Figure 2A:
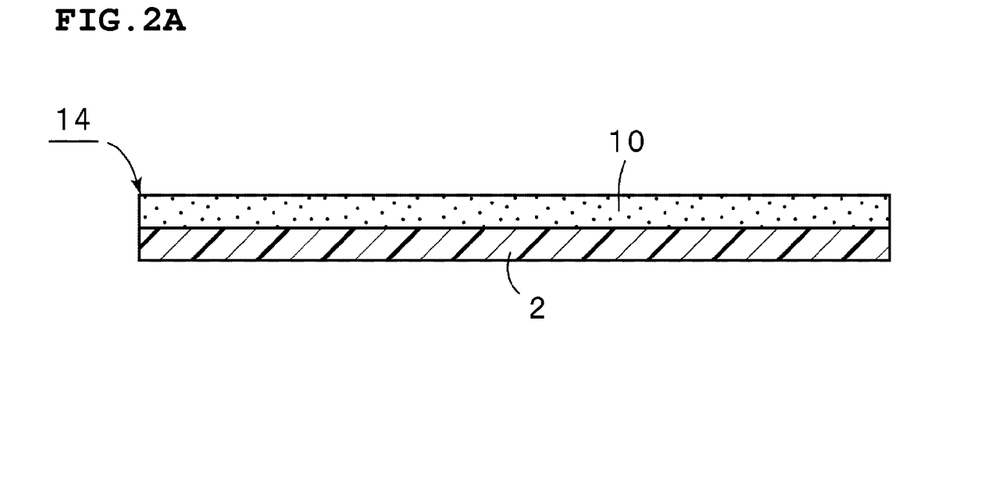
FIG. 2A is a view showing the state in which a ceramic green sheet is provided on a base film.

That is, as shown in FIG. 2A, a ceramic green sheet 10 is formed on the base film 2. The ceramic green sheet 10 thus dried is then taken up together with the base film 2 by the take-up roller 7 through rollers 11 and 12.

In this preferred embodiment, the ceramic slurry is applied to the base film 2 by the die coater 4, and compared to another coating device, for example, having a gravure roller, a doctor blade, a reverse roll coater, or the like, the die coater 4 can form a ceramic green sheet 10 having a thickness of approximately 10 μm or less with high accuracy. In particular, even when a ceramic green sheet having a thickness of approximately 2 μm or less is formed, variations in thickness thereof can be controlled to about 10% or less, and any pinholes or lines are not formed on the surface of the ceramic green sheet 10.

In addition, the surface roughness can be controlled to about 0.2 μm or less. In addition, when the die coater 4 is used, the ceramic slurry can be coated at a speed of about 50 m/min or more.

Accordingly, in this preferred embodiment, a thin ceramic green sheet 10 without any pinholes can be formed at a high speed. In addition, a ceramic green sheet having a small variation in thickness and superior surface smoothness, as described above, can be obtained.

The ceramic slurry described above is not specifically limited, and an appropriate dielectric ceramic, such as a barium titanate-based ceramic, for forming multilayer ceramic capacitors may be used as a primary component together with a solvent, binding resin, and other suitable material.

Next, a composite sheet composed of the ceramic green sheet 10 provided on the base film 2 is supplied from the take-up reel 7 to a gravure printing apparatus shown in FIG. 1B.

As shown in FIG. 1B, a composite sheet 14 composed of the ceramic green sheet 10 provided on one major surface of the base film 2 is supplied to a first gravure printing apparatus 21 so that the ceramic green sheet 10 faces downward. In this first gravure printing apparatus 21, the composite sheet 14 is conveyed in the length direction through rollers 22 and 23 and is then supplied between a gravure roller 24 and a pressure roller 25. A lower part of the gravure roller 24 is immersed in conductive paste 26. The gravure roller 24 is rotated in the direction indicated by the arrow in the figure. In addition, on the peripheral surface of the gravure roller 24, a plurality of printing portions in conformity with an internal electrode pattern to be formed are dispersed in the circumferential direction.

In the figure, reference numeral 27 indicates a blade for scraping excess conductive paste off of the roller.

Figure 2B:
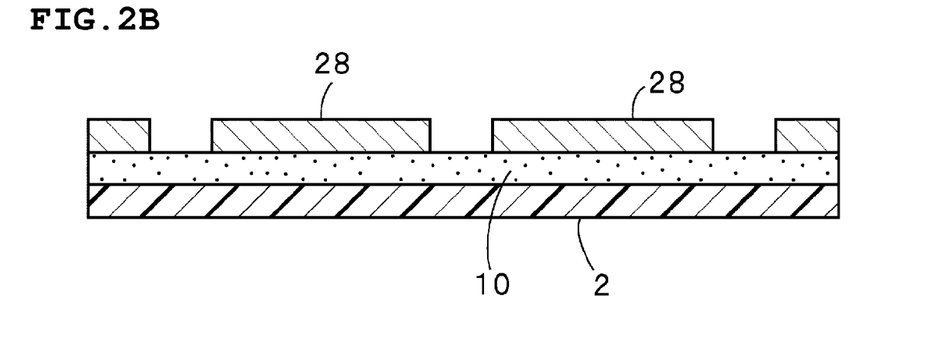
FIG. 2B is a view showing the state in which internal electrodes are printed onto the ceramic green sheet.

While the composite sheet 14 passes between the gravure roller 24 and the pressure roller 25, conductive paste is applied to the surface of the ceramic green sheet 10 constituting the composite sheet 14 so as to form a shape in accordance with a printing figure formed on the gravure roller 24, thereby forming internal electrodes 28 shown in FIG. 2B.

Subsequently, a plurality of the composite sheets 14 is conveyed to a drying furnace 30 through a roller 29, and in this drying furnace 30, the internal electrodes 28 are partially dried or dried.

In the drying furnace 30, an appropriate heater is arranged so as to remove a solvent contained in the conductive paste by heating. In this case, it is not always necessary to remove the entire solvent from the internal electrode 28, and drying may be performed so that exudation and other problems or defects are unlikely to occur along the periphery of the internal electrode 28. That is, the internal electrode 28 in a partially dried state may be supplied from the drying furnace 30.

Next, the composite sheet including the internal electrodes 28 is supplied to a second gravure printing apparatus 34 through rollers 31 to 33. The second gravure printing apparatus 34 has a gravure roller 35 and a pressure roller 36. In this apparatus, printing portions are provided on the peripheral surface of the gravure roller 35 for applying ceramic paste to regions other than those in which the internal electrodes 28 are formed.

That is, the printing portions are provided on the peripheral surface of the gravure roller 35 for printing step-smoothing ceramic paste. A lower part of the gravure roller 35 is immersed in ceramic paste 37. In the figure, reference numeral 38 indicates a blade for scraping excess ceramic paste off of the roller. While the composite sheet described above is allowed to pass through between the gravure roller 35 and the pressure roller 36, the ceramic paste 37 is printed onto one major surface of the ceramic green sheet of the composite sheet except for regions in which the internal electrodes 28 are formed (see FIG. 2C). That is, around the internal electrodes 28, ceramic paste layers 48 for smoothing steps are formed. Subsequently, the composite sheet thus formed is supplied to a drying furnace 40 through a roller 39, and in this drying furnace 40, the ceramic paste layers 48 are dried. When being in a semi-dried state, the internal electrodes 28 are also dried in the drying furnace 40. As described above, a composite sheet 41 shown in FIG. 2C is supplied from the drying furnace 40 through a roller 42.

The second drying furnace 40 has a structure that is substantially equivalent to that of the first drying furnace 30. However, heating in the drying furnace 40 is performed so as to dry the ceramic paste layers 48. As described above, the composite sheet 41 shown in FIG. 2C is obtained, and when a plurality of the composite sheets 41 is laminated to each other, a laminate is obtained. In this preferred embodiment, as shown in FIG. 3, when the composite sheets 41 are laminated to each other, a plain ceramic green sheet 44 is first laminated on a lamination stage 43. The ceramic green sheet provided on the base film 2 is unwound from the take-up reel 7, is then cut, for example, into a substantially rectangular shape, and subsequently, is transferred on the lamination stage 43, thereby forming the plain ceramic green sheet 44. In this preferred embodiment, the plain ceramic green sheet 44 may be formed by printing ceramic paste directly onto the lamination stage 43, or may be composed of a plurality of plain ceramic green sheets 44.

Figure 2C:
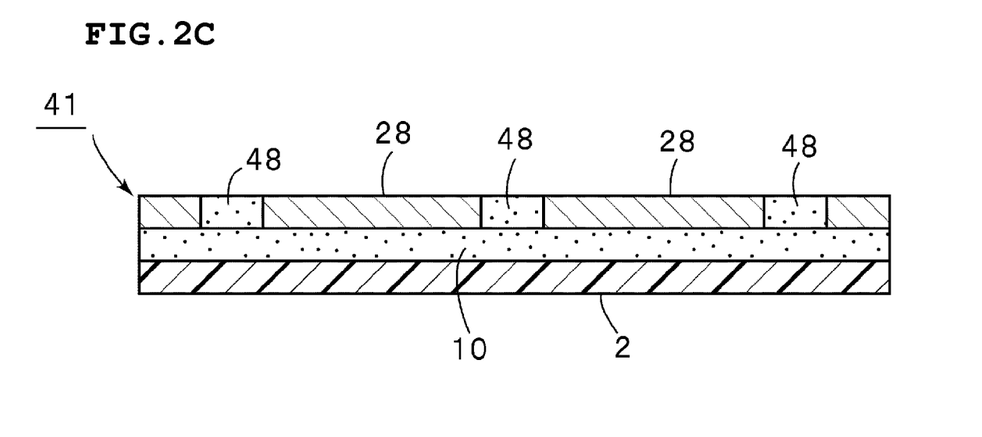
FIG. 2C is a view showing the state in which step-smoothing ceramic paste is printed.
Figure 3:
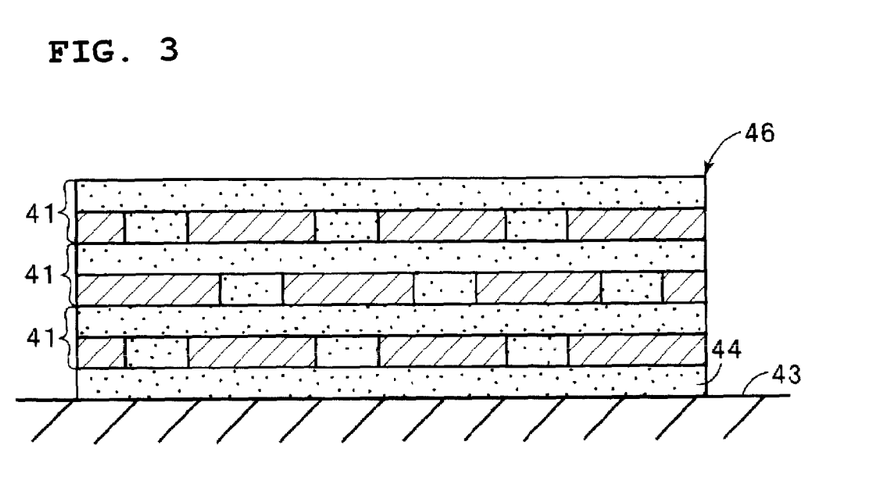
FIG. 3 is a cross-sectional view of a mother laminate formed on a lamination stage by a transfer process.

Next, the composite sheet 41 shown in FIG. 2C is punched out into a predetermined shape and is then provided on the ceramic green sheet 44 by a transfer method, and subsequently, the base film 2 is peeled off. In a step of punching out the composite sheet 41, the composite sheet 41 is punched out, for example, into a substantially rectangular shape. The base film 2 may not be punched out. That is, while being provided on the base film 2 which is half cut, the composite sheet 41 which is punched out may be transferred, or the composite sheet 41 which is punched out together with the base film 2 may be laminated on the ceramic green sheet 44 by transfer.

Both the transfer and the lamination of the composite sheet 41 are each repeated at least two times, thereby forming a mother laminate 46 shown in FIG. 3.

Figure 4:
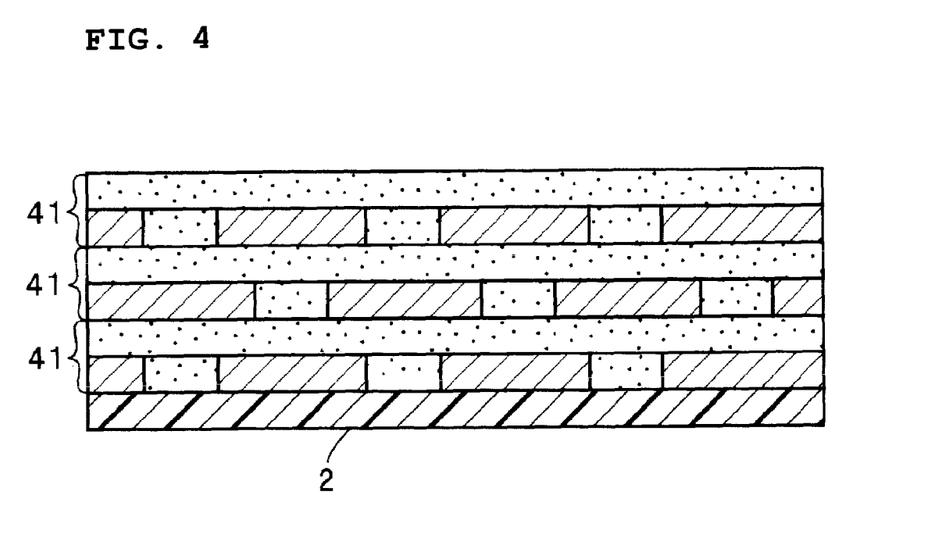
FIG. 4 is a cross-sectional view of the structure formed of a plurality of composite sheets provided on a base film.

In this preferred embodiment, the composite sheet 41 is formed on the base film 2, and transfer of the composite sheet 41 thus formed on the base film 2 is performed at least two times. However, as shown in FIG. 4, a plurality of the composite sheets 41 may be formed on the base film 2. That is, a plurality of the composite sheets 41 is laminated beforehand on the base film 2 by transfer (the composite sheet 41 side is laminated by compression, and the base film 2 is then removed), and the laminate thus obtained may be transferred onto the lamination stage 43. In addition, by processing the composite sheet 41 alternately by the die coater shown in FIG. 1A and by the first and second gravure printing apparatuses shown in FIG. 1B at least two times, a plurality of the composite sheets 41 is laminated beforehand on the base film 2, and the laminate thus obtained may be transferred on the lamination stage 43. In these cases, since a plurality of the composite sheets 41 is laminated on one surface of the base film 2, the number of transfer performed on the lamination stage 43 can be decreased.

The mother laminate 46 thus formed is compressed in the thickness direction and is then cut into laminates each used for forming one ceramic capacitor. In this case, since the ceramic paste layers for smoothing steps are formed between the internal electrodes, steps are prevented from being formed between the portion at which the internal electrodes overlap each other and the portion at which the internal electrodes are not formed.

Figure 5:
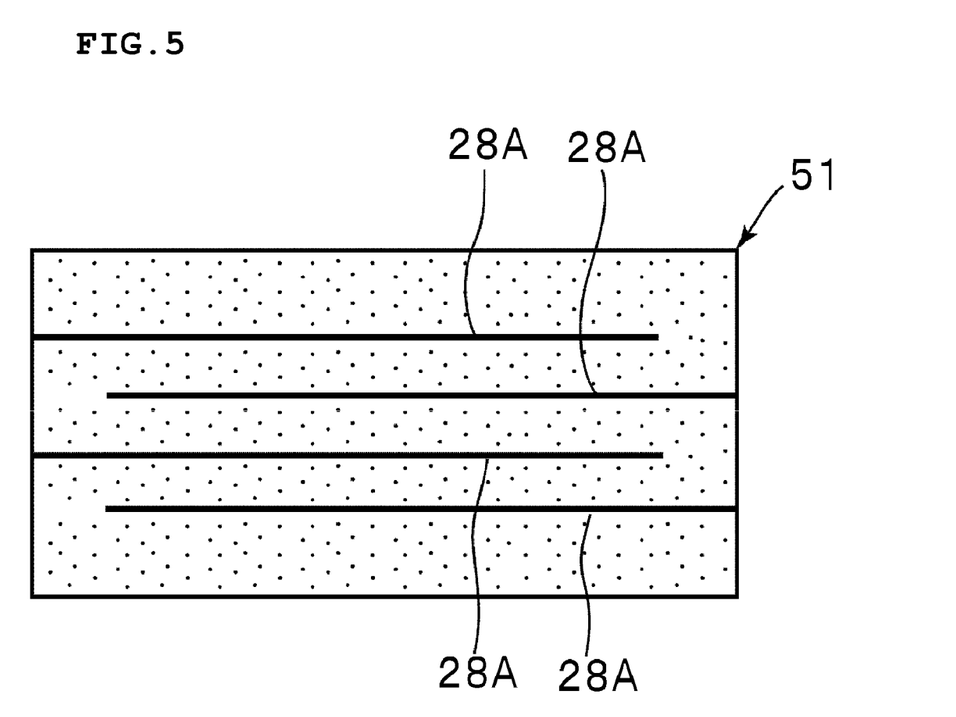
FIG. 5 is a front cross-sectional view of a ceramic sintered body for forming one multilayer capacitor.
Figure 6:
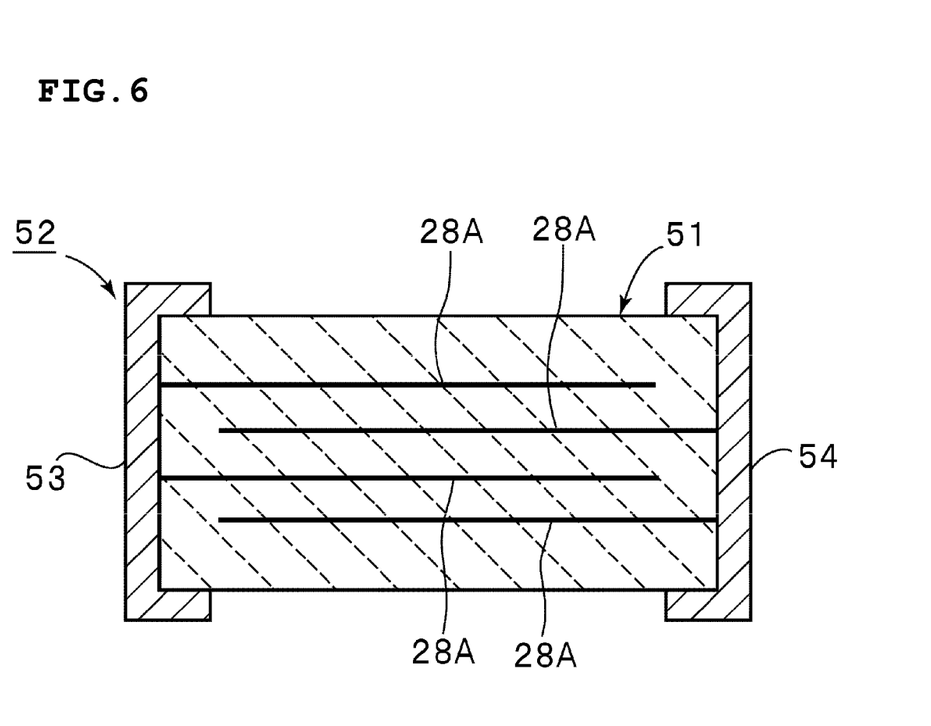
FIG. 6 is a front cross-sectional view of a multilayer ceramic capacitor according to a preferred embodiment of the present invention.

Subsequently, by firing each multilayer ceramic capacitor unit thus formed, a ceramic sintered body 51 shown in FIG. 5 is obtained. When a first and a second external electrode are formed on two end surfaces of the ceramic sintered body 51, a multilayer ceramic capacitor 52 shown in FIG. 6 is obtained. In the multilayer ceramic capacitor 52, the ceramic sintered body 51 includes a plurality of internal electrodes 28A, which are obtained by cutting the internal electrodes 28 described above, and laminated to each other with ceramic layers provided therebetween. In addition, external electrodes 53 and 54 are each formed to be connected to the internal electrodes.

According to the manufacturing method of this preferred embodiment, as described above, by using the die coater 4, the ceramic green sheet 10 is formed. Hence, the productivity of the ceramic green sheet can be improved. In addition, as described above, the ceramic green sheet 10 has a minimal small variation in thickness, significantly fewer defects, and superior surface smoothness. In addition, by using the first and the second gravure printing apparatuses, the internal electrodes and the step-smoothing ceramic paste can be continuously performed. As a result, the composite sheets 41 used for forming the laminate described above can be efficiently formed, and hence, in addition to improvement in productivity of the multilayer capacitor 52, a significant decrease in variations of the properties can be achieved.

In addition, in this preferred embodiment, since the drying conditions for the internal electrodes 28 and those for the step-smoothing ceramic paste can be separately determined, overdrying or underdrying of the internal electrode 28 and the step-smoothing ceramic paste can be reliably prevented. That is, when the internal electrodes and the step-smoothing ceramic paste are simultaneously dried as in a conventional example, overdrying or underdrying may occur for the internal electrodes or the ceramic paste described above in some cases. However, in this preferred embodiment, the overdrying or underdrying as described above is reliably prevented.

In this preferred embodiment, since the step-smoothing ceramic paste is printed after the internal electrodes 28 are formed and are then dried once, influence of the solvent, which is contained in the conductive paste forming the internal electrodes, on the ceramic green sheet can be decreased. In addition, when the ceramic paste is printed, the internal electrodes are unlikely to be damaged, and both the internal electrodes and the ceramic paste can be formed with high accuracy.

In addition, for example, when the drying conditions are optimized so that the internal electrodes are each dried without being damaged or peeled off even when convex portions (portions other than concave portions in which the step-smoothing ceramic paste is supplied) of the gravure roller compress the internal electrodes, in a step of printing the step-smoothing ceramic paste, since being compressed by the convex portions of the gravure roller, the internal electrodes can be planarized or smoothed.

Furthermore, since the step-smoothing ceramic paste is printed after the internal electrodes are dried, when the step-smoothing ceramic paste is repeatedly printed along the periphery of the internal electrode pattern in order to solve a problem of printing misalignment of the step-smoothing ceramic paste, the peripheral portions of the internal electrode pattern are planarized or smoothed, and hence the smoothness in the boundaries between the internal electrodes and the step-smoothing ceramic paste is further improved.

Alternatively, in various preferred embodiments of the present invention, after printing and drying of the step-smoothing ceramic paste are performed, the internal electrodes may be printed followed by drying. In this case, as is the case described above, influence of the solvent on the ceramic green sheet is minimized, and in addition, both the internal electrodes and the ceramic paste are printed with high accuracy.

As described above, since the thickness of the ceramic green sheet is uniformly formed by the die coater 4, variations in tension of the sheet can be decreased when gravure printing is performed, and hence alignment of the internal electrodes with the step-smoothing ceramic paste can be performed with high accuracy. Since the surface of the ceramic green sheet 10 is smooth, the internal electrodes 28 and the step-smoothing ceramic paste can be applied to the smooth ceramic green sheet with high accuracy by gravure printing. As a result, the external dimension accuracies and the surface smoothness of the internal electrodes and the step-smoothing ceramic paste can be improved.

In this preferred embodiment, since the ceramic green sheet is formed preferably by using the die coater 4, as described above, a ceramic green sheet having a very small thickness of approximately 2 μm or less can be accurately formed without generating defects such as pinholes. As a result, a high-capacitance multilayer ceramic capacitor formed of a great number of layers laminated to each other can be readily and reliably formed.

In addition, in this preferred embodiment, after being formed by the die coater 4, the ceramic green sheet 10 provided on the base film 2 is taken up by the take-up reel 7. Hence, a problem of unbalance between the formation of the ceramic green sheet at a high speed by the die coater 4 and the gravure printing at a low speed can be solved. That is, when gravure printing is performed right after the ceramic green sheet is formed by the die coater 4, since the speed is low in the following gravure printing step, both steps cannot be well balanced. However, in this preferred embodiment, since the ceramic green sheet 10 provided on the base film 2 is taken up once by the take-up reel 7, the problem of unbalance in the speed described above can be solved.

As another preferred embodiment, when the laminate 46 is formed, a second ceramic green sheet 100 may be formed on the composite sheet 41 shown in FIG. 2C by a die coating method, as in the above-described preferred embodiment, for forming an intermediate laminate 410. Subsequently, a plurality of the intermediate laminates 410 thus formed may be laminated to each other to form a laminate 460 shown in FIG. 10.

Figure 10:
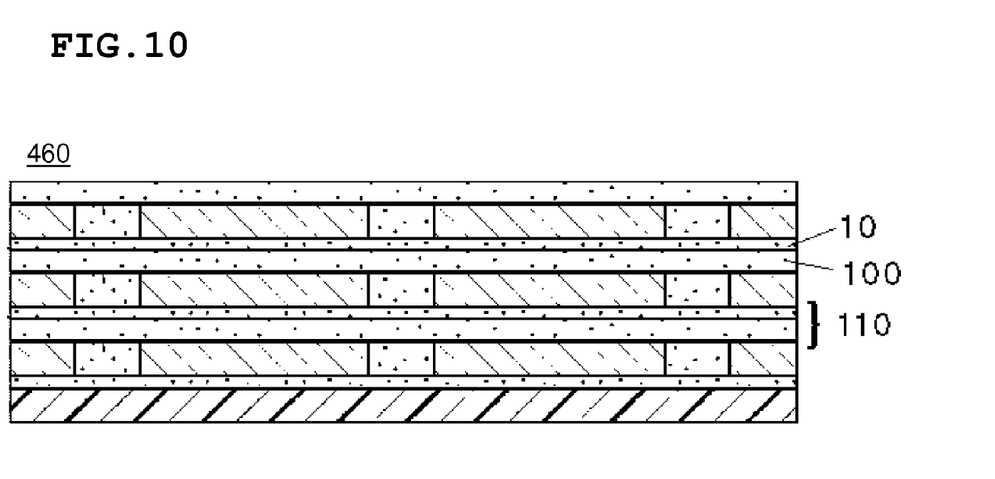
FIG. 10 is a cross-sectional view showing a laminate formed of the intermediate laminates shown in FIG. 9.

In the laminate 460, the ceramic green sheet 10 and the second ceramic green sheet 100 are bonded to each other to form a dielectric layer 110. The thickness of this dielectric layer 110 is preferably approximately 3.0 μm or less, and hence the thicknesses of the ceramic green sheet 10 and the second ceramic green sheet 100 are determined so as to meet the thickness described above.

The laminate 460 is cut in the thickness direction so as to form individual unit bodies, and the unit bodies thus formed are coated with conductive paste and are then fired to form external electrodes, thereby forming multilayer ceramic capacitors.

According to the structure described above, since the dielectric layer is formed of the ceramic green sheet 10 which is influenced by the solvent contained in the conductive paste and the second ceramic green sheet 100 which is not influenced thereby, sheet damage to the dielectric layer by the solvent can be minimized, and hence short-circuiting or insulation defects between the layers are reliably prevented.

In addition, it is preferable that the thickness of the ceramic green sheet 10 be sufficiently smaller than that of the second ceramic green sheet 100. That is, the ceramic green sheet 10 incurs the sheet damage because of the solvent contained in each paste. Accordingly, as the ratio in thickness of the ceramic green sheet 10 to the dielectric layer is decreased, the influence on the dielectric layer can be decreased.

Figure 9:
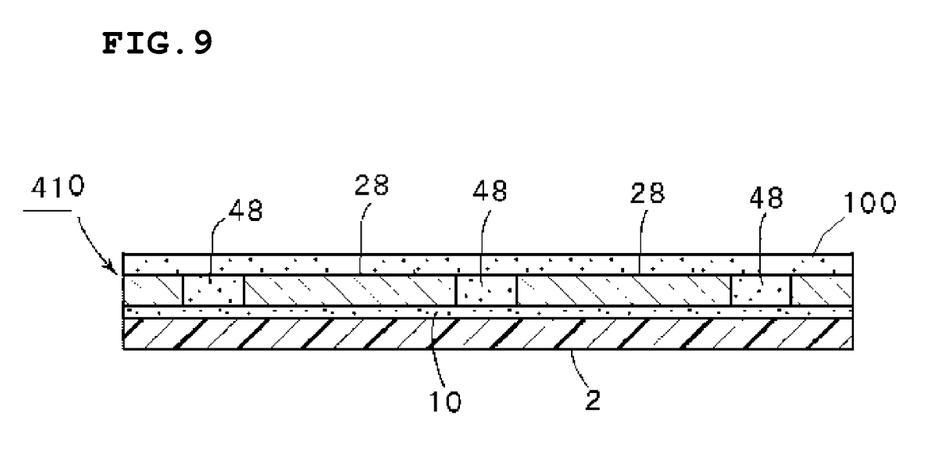
FIG. 9 is a cross-sectional view showing an intermediate laminate formed by providing a second ceramic green sheet on both internal electrodes and step-smoothing ceramic paste, which are provided on a ceramic green sheet.

When the intermediate laminate 410 is formed, the step-smoothing ceramic paste and the second ceramic green sheet may be simultaneously formed by a die coating method.

According to the method of a preferred embodiment of the present invention for manufacturing a multilayer ceramic electronic element, the ceramic green sheet is first formed on the base film by using the die coater. In a conventional method for forming a ceramic green sheet by gravure printing, the ceramic green sheet is formed at a low speed, and when a thin ceramic green sheet that is approximately 2 μm thick or less is formed, problems may arise in that pinholes are liable to be formed, and that irregularities may be formed on the surface of the ceramic green sheet. In contrast, according to preferred embodiments of the present invention, since the formation of the ceramic green sheet is performed using the die coater, the ceramic green sheet can be formed in a short period of time. In addition, even when the ceramic green sheet has a small thickness, structural defects such as pinholes are unlikely to occur. Furthermore, the surface smoothness of the ceramic green sheet can be improved, and in addition, variations in thickness can be significantly decreased.

Since the speed for forming the ceramic green sheet can be increased according to preferred embodiments of the present invention, the cost for manufacturing the ceramic green sheet, in other words, the cost for manufacturing a multilayer ceramic electronic element, is significantly decreased.

In addition, since the ceramic green sheet of preferred embodiments of the present invention has superior surface smoothness and a very small variation in thickness, when printing of the internal electrodes and that of the step-smoothing ceramic paste are then performed by gravure printing, the internal electrodes and the ceramic paste can also be formed on the ceramic green sheet with high accuracy.

In particular, when the conductive paste for forming the internal electrodes or the step-smoothing ceramic paste is printed by gravure printing, in order to improve leveling properties after transfer and to improve wettability when transfer is performed, paste having a relatively low viscosity is frequently used as the paste described above. However, the paste having a low viscosity is liable to exude. This exudation mentioned above becomes more likely to occur as the degree of surface roughness of the ceramic green sheet to which the paste is applied is increased. However, according to preferred embodiments of the present invention, since the surface smoothness of the ceramic green sheet is greatly improved as described above, even when paste having a low viscosity is used, the exudation described above is prevented from occurring. As a result, with the improvement described above, the exterior-dimension accuracies of the internal electrodes and the step-smoothing ceramic paste is also greatly improved.

In addition, when the internal electrodes and the step-smoothing ceramic paste are sequentially printed by gravure printing, in other words, when two-color printing is performed, variations in tension of the base film and meandering thereof must be suppressed, and in addition, a ceramic green sheet having a very small variation in thickness must be prepared. When variations in thickness in the length direction of the long ceramic green sheet are generated, the length of the ceramic green sheet in a path line between the first and the second gravure printing apparatuses may vary, and as a result, accuracy in positioning in the length direction is degraded. Furthermore, when the thickness of the ceramic green sheet varies in the width direction, meandering occurs, and as a result, the accuracy in positioning in the width direction is degraded when gravure printing is performed.

According to a conventional method in which the formation of a ceramic green sheet is also performed by gravure printing, when the thickness of the ceramic green sheet in the length direction is changed, for example, by about 1 μm, the path line length is changed by approximately 13 μm, and as a result, the accuracy in positioning in the length direction is degraded. In addition, concerning the accuracy in the width direction, for example, when the thickness of a sheet at one side is larger than that at the other side of the sheet, the sheet meanders to the side at which the thickness of the sheet is smaller, and hence the accuracy in positioning in the width direction is degraded.

In contrast, according to preferred embodiments of the present invention, since the ceramic green sheet having a very small variation in thickness can be formed by the die coater as described above, when the internal electrodes and the step-smoothing ceramic paste are printed by performing gravure printing twice, the printing accuracies in the length direction and in the width direction are effectively improved.

According to preferred embodiments of the present invention, when the formation of the ceramic green sheet using the die coater and the printing of the internal electrodes and the step-smoothing ceramic paste using gravure printing are performed in combination, the accuracies in external dimensions and positioning of the ceramic green sheet, and the internal electrodes and the step-smoothing ceramic paste, which are formed on the ceramic green sheet, can be effectively improved, and as a result, a multilayer ceramic electronic element having a small variation in properties can be reliably obtained with a high productivity.

Furthermore, a particularly novel feature of preferred embodiments of the present invention is that the step of drying or semi-drying the internal electrodes is performed continuously after the formation thereof. Accordingly, the affect on the ceramic green sheet of the solvent contained in the conductive paste for forming the internal electrodes is reliably prevented, and hence the damage to the internal electrodes is minimized. In addition, since the gravure roller for smoothing steps can planarize the internal electrodes, both the internal electrodes and the step-smoothing ceramic paste are formed with high accuracy.

While the present invention has been described with reference to what are at present considered to be the preferred embodiments, it is to be understood that various changes and modifications may be made thereto without departing from the present invention in its broader aspects and therefore, it is intended that the appended claims cover all such changes and modifications that fall within the true spirit and scope of the invention.

What is claimed is:

1. A method for manufacturing a multilayer ceramic electronic element, comprising the steps of:
   preparing a composite sheet by sequential performance of the following steps in that order;
   a first step of applying ceramic slurry to a long base film using a die coater for forming a ceramic green sheet;
   a second step of applying conductive paste to an upper surface of the ceramic green sheet by gravure printing using a plurality of conveying rollers, a pressure roller, and a gravure roller, for forming internal electrodes;
   a third step of drying or semi-drying the internal electrodes
   a fourth step of applying a step-smoothing ceramic paste to the upper surface of the ceramic green sheet in a region in which the internal electrodes are not formed by gravure printing using a plurality of conveying rollers, a pressure roller, and a gravure roller; and
   a fifth step of drying the step-smoothing ceramic paste;
   a sixth step of applying ceramic slurry to the internal electrodes and the dried ceramic paste using a die coater for forming another ceramic green sheet;
   a seventh step of applying conductive paste to an upper surface of the another ceramic green sheet by gravure printing using a plurality of conveying rollers, a pressure roller, and a gravure roller, for forming the internal electrodes;
   an eighth step of drying or semi-drying the internal electrodes
   a ninth step of applying the step-smoothing ceramic paste to the upper surface of the another ceramic green sheet in a region in which the internal electrodes are not formed by gravure printing using a plurality of conveying rollers, a pressure roller, and a gravure roller; and
   a tenth step of drying the step-smoothing ceramic paste;
   the sixth to tenth steps being performed at least once;
   forming a laminate body by laminating a plurality of the composite sheets to each other;
   sintering the laminate body to form a sintered body; and
   forming external electrodes electrically connected to the respective internal electrodes on an external surface of the sintered body.

2. The method for manufacturing a multilayer ceramic electronic element according to claim 1, wherein the second step is performed while the long base film is conveyed in a length direction thereof.

3. The method for manufacturing a multilayer ceramic electronic element according to claim 1, wherein the fourth step is continuously performed while the long base film is conveyed in the length direction thereof.

4. The method for manufacturing a multilayer ceramic electronic element according to claim 1, wherein the ceramic green sheet and the step-smoothing ceramic paste are primarily a dielectric ceramic used to produce a multilayer ceramic capacitor as the multilayer ceramic electronic element.

5. The method for manufacturing a multilayer ceramic electronic element according to claim 1, wherein the long base film is made of a synthetic resin.

6. The method for manufacturing a multilayer ceramic electronic element according to claim 5, wherein the synthetic resin is formed of one of polypropylene, poly (ethylene terephthalate), or poly(ethylene naphthalate).

7. The method for manufacturing a multilayer ceramic electronic element according to claim 1, wherein the die coater used in the first step includes a coating head, a plurality of rollers, a tank and a pump, and the coating head is disposed adjacent to the tank such that the pump supplies the ceramic slurry to the coating head via the tank.

8. The method for manufacturing a multilayer ceramic electronic element according to claim 1, wherein during the step of forming the laminate body, the long base film is conveyed from a supply roller to a take up roller.

9. The method for manufacturing a multilayer ceramic electronic element according to claim 1, wherein prior to the step of forming the laminate body, a plain ceramic green sheet having neither the internal electrodes nor the step-smoothing ceramic paste applied thereto is laminated on a lamination stage.

10. The method for manufacturing a multilayer ceramic electronic element according to claim 9, wherein after the step of forming the laminate body, a plain ceramic green sheet having neither the internal electrodes nor the step-smoothing ceramic paste applied thereto is laminated on the laminate body.

11. The method for manufacturing a multilayer ceramic electronic element according to claim 1, wherein after the step of forming the laminate body, a plain ceramic green sheet having neither the internal electrodes nor the step-smoothing ceramic paste applied thereto is laminated on the laminate body.

* * * * *